United States Patent
Abdelfattah et al.

(10) Patent No.: US 10,804,854 B1
(45) Date of Patent: Oct. 13, 2020

(54) MULTI-LEVEL POWER SUPPLY ARCHITECTURE FOR RADIO FREQUENCY POWER AMPLIFIERS

(71) Applicant: QUALCOMM Incorporated, San Diego, CA (US)

(72) Inventors: Moataz Abdelsamie Abdelfattah, San Diego, CA (US); Mukesh Bansal, San Diego, CA (US); Iulian Mirea, San Diego, CA (US); Song Shi, San Diego, CA (US); Pengfei Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/556,085

(22) Filed: Aug. 29, 2019

(51) Int. Cl.
*H03F 1/02* (2006.01)
*H02M 3/158* (2006.01)
*H02M 1/088* (2006.01)

(52) U.S. Cl.
CPC .......... *H03F 1/0227* (2013.01); *H02M 1/088* (2013.01); *H02M 3/158* (2013.01)

(58) Field of Classification Search
CPC ...... H02M 3/158; H02M 1/088; H02M 1/096; H03F 1/0227
See application file for complete search history.

(56) References Cited

U.S. PATENT DOCUMENTS

| | | | | |
|---|---|---|---|---|
| 2010/0283439 A1* | 11/2010 | Singh | .................... | H02M 1/088 323/282 |
| 2011/0148368 A1* | 6/2011 | Burns | .................. | H03K 17/102 323/225 |
| 2012/0326680 A1* | 12/2012 | Burns | ................. | H02M 3/1588 323/224 |
| 2019/0379271 A1* | 12/2019 | Chen | .................... | H02M 3/1582 |

OTHER PUBLICATIONS

Nomiyama T., et al., "A 2TX Supply Modulator for Envelope-Tracking Power Amplifier Supporting Intra- and Inter-Band Uplink Carrier Aggregation and Power Class-2 High-Power User Equipment", 2018 IEEE International Solid-State Circuits Conference, IEEE, pp. 434-436.
Yousefzadeh, V., et al., "Three-Level Buck Converter for Envelope Tracking Applications", IEEE Transactions on Power Electronics, vol. 21, No. 2, Mar. 2006, pp. 549-552.

* cited by examiner

*Primary Examiner* — Fred E Finch, III
*Assistant Examiner* — Rafael O De Leon Domenech
(74) *Attorney, Agent, or Firm* — Qualcomm Incorporated

(57) ABSTRACT

A tri-level converter provides three levels of power supply to a power amplifier that includes a supply path. The supply path has a first transistor and a first inherent body diode associated with the first transistor, as well as a second transistor and a second inherent body diode associated with the second transistor. A polarity of the second body diode is reversed relative to a polarity of the first body diode. A first driver is configured to drive the first transistor and the first inherent body diode to control a power supply, including a (Continued)

battery supply signal, to an output of the tri-level converter. The tri-level converter is coupled to a switching node.

19 Claims, 9 Drawing Sheets

MULTI-LEVEL POWER SUPPLY ARCHITECTURE FOR RADIO FREQUENCY POWER AMPLIFIERS

TECHNICAL FIELD

The present disclosure generally relates to a power supply architecture. More specifically, the present disclosure relates to multi-level power supply architectures for radio frequency power amplifiers.

BACKGROUND

Wireless communications devices include a power amplifier (PA) to provide transmit power for an output radio frequency (RF) signal. The wireless or mobile communications devices include the power amplifier to amplify an input RF signal to a desired level for transmission, which may depend on how far the user is away from a base station. Next generation wireless systems use a wideband technology that allows for simultaneously transmitting multiple transmit signals, corresponding to different baseband signals, to one or more base stations over multiple channels. Some mobile communications devices specify transmitting the multiple transmit signals using a single power amplifier.

Because power amplification consumes power, techniques to improve the efficiency of power amplifiers may be implemented in wireless communications devices in order to prolong operation on a battery charge. Such techniques may include adjusting the power supplied to the power amplifier so that the applied power tracks the amount of power in the transmit signal. Adjusting the applied power based on the transmit signal is referred to generally as "envelope tracking" and there are different modes of envelope tracking that can be implemented.

Radio frequency transmitters often implement envelope tracking (ET) power systems to improve efficiency of power amplifiers. These ET power systems include highly efficient switch-mode power supplies (SMPS) or switching DC-DC converters that provide power to the power amplifiers. ET power systems modulate a power supply to the radio frequency power amplifier.

SUMMARY

A tri-level converter includes a first supply path coupled to a first supply. The first supply path is configured to receive a first supply signal. The first supply path includes a first transistor having a first terminal coupled to a switching node of the tri-level converter and a first body diode polarity with respect to a second terminal of the first transistor. The first supply path also includes a second transistor having a first terminal coupled to the second terminal of the first transistor and a second terminal coupled to the first supply of the tri-level converter. The second transistor includes a second body diode polarity with respect to the second terminal of the second transistor. The second body diode polarity is reversed relative to the first body diode polarity. The first supply path also includes a first driver configured to drive the first transistor to control an output voltage at an output of the tri-level converter, which is coupled to the switching node.

A method controls back-to-back transistor-diode pairs in a battery supply path of a tri-level converter of an envelope tracking system. The method includes switching a first transistor-diode pair in the battery supply path while maintaining an on-state of a second transistor-diode pair in the battery supply path in accordance with a low-side switching scheme to generate an output power supply of the tri-level converter between ground and a battery supply signal. The method also includes switching the second transistor-diode pair while maintaining an on-state of the first transistor-diode pair in accordance with a high-side switching scheme to generate an output power supply of the tri-level converter between a boosted power supply signal and the battery supply signal. A polarity of a second body diode of the second transistor-diode pair is reversed relative to a polarity of a first body diode of the first transistor-diode pair.

A tri-level converter includes a first supply path coupled to a first supply. The first supply path is configured to receive a first supply signal. The first supply path includes a first transistor having a first terminal coupled to a switching node of the tri-level converter and a first body diode polarity with respect to a second terminal of the first transistor. The first supply path also includes a second transistor having a first terminal coupled to the second terminal of the first transistor and a second terminal coupled to the first supply of the tri-level converter. The second transistor includes a second body diode polarity with respect to the second terminal of the second transistor. The second body diode polarity is reversed relative to the first body diode polarity. The first supply path includes means for driving the first transistor to control an output voltage at an output of the tri-level converter, which is coupled to the switching node.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
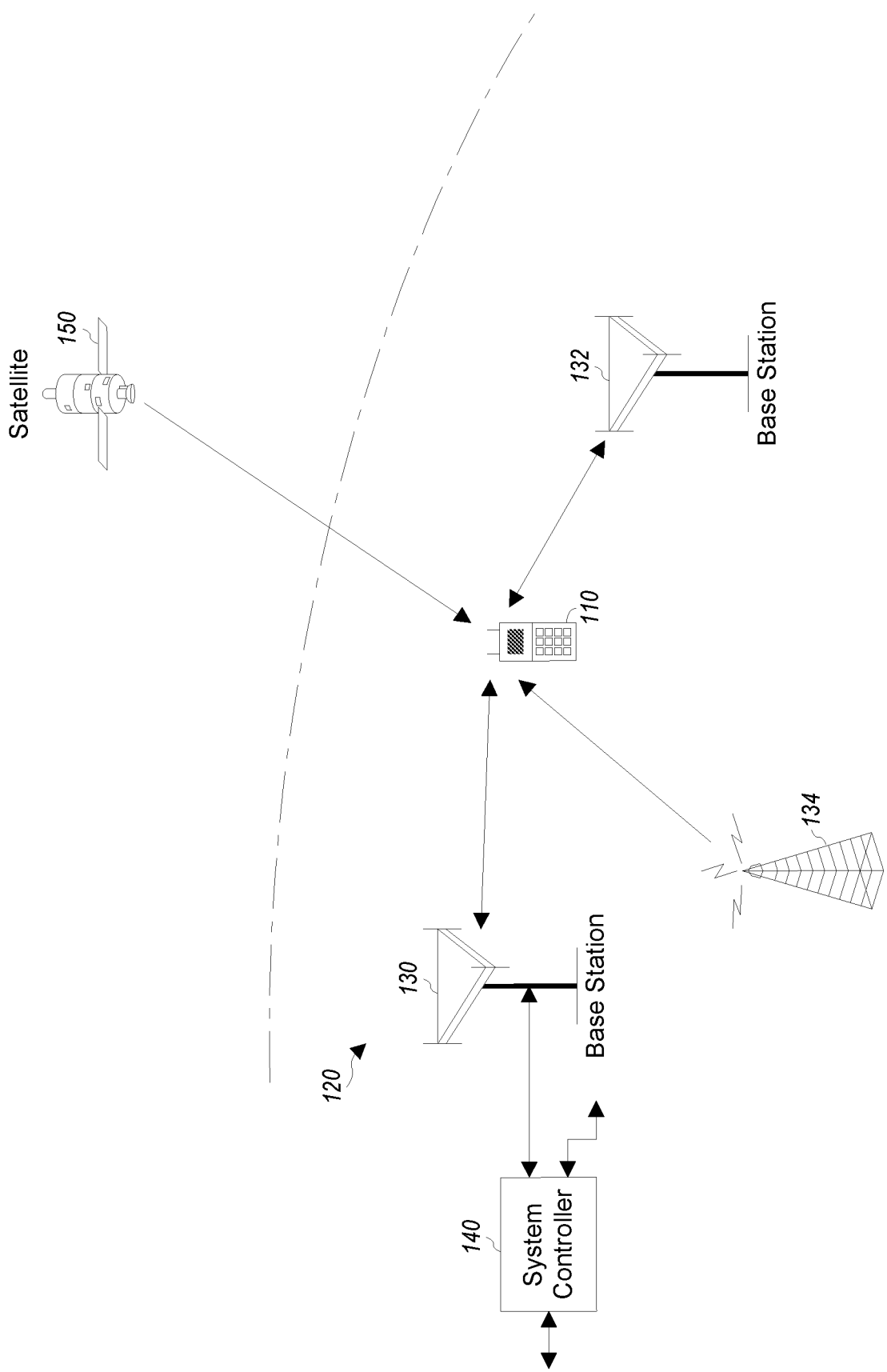
FIG. 1 shows a wireless device communicating with a wireless communications system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A wireless communications device, such as a user equipment (UE), may include transmit chains that are composed of multiple radio frequency (RF) transmitters, multiple power amplifiers, multiple antennas, and one or more front end (FE) devices through which signals are transmitted from the UE. The transmit chains of the UE, however, may include a class of power amplifiers that are designed for meeting a power level specified for a current device generation.

The UE may be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

A power amplifier may include an input port coupled to an envelope tracking supply to receive an adjusted power supply from the envelope tracking supply. The envelope tracking supply may be coupled between a first baseband processor (e.g., modem) and the power amplifier. With envelope tracking, the RF signal from a power supply voltage applied to the power amplifier through the envelope tracking supply is continuously adjusted based on an envelope signal from the first baseband processor to ensure that the amplifier is operating at peak efficiency for power specified at each instance of transmission.

Aspects of the present disclosure are directed to an envelope tracking system or chip that performs envelope tracking for a power amplifier. For example, the envelope tracking system supplies power to the power amplifier (e.g., radio frequency power amplifier) based on an envelope of a radio frequency signal. To improve efficiency, a power supply signal from a power source to the power amplifier is specified higher than a battery power supply signal (e.g., battery voltage Vbat) supplied from a battery. To achieve the higher power supply, an auxiliary power Vaux is specified. The auxiliary power Vaux may be a boosted power supply signal from the battery.

The envelope tracking system may include a multi-level (e.g., tri-level) converter architecture. The tri-level converter switches between three levels or states (e.g., Vaux, Vbat, and ground), rather than from only two levels (e.g., a high supply to ground), which can result in an improvement of efficiency when using the tri-level converter and therefore may be better for use in an envelope tracking system.

The tri-level converter includes a power stage that is more reliable than conventional tri-level converters. For example, conventional tri-level converters are subject to high inductance associated with their out-of-chip decoupling capacitor. Other conventional tri-level converters have no direct path from a battery. Accordingly, a supply voltage for the conventional tri-level converter has to be at a boost level all of the time, which can cause a loss in efficiency.

In one aspect of the present disclosure, a power stage of the tri-level converter provides the three levels of power supply to the power amplifier. The first level is the boosted power supply signal (e.g., voltage) from an auxiliary power supply source, the second level is the battery power supply signal (e.g., battery voltage) from a battery, and the third level is a ground signal from a ground. The power stage includes a direct path from a battery (e.g., battery power supply path) and a direct path from a boosted/auxiliary power supply (e.g., boosted power supply path). The battery power supply path includes back-to-back diode circuitry. For example, the battery power supply path includes a first transistor (e.g., a first power field effect transistor) and its corresponding first body diode and a second transistor and its corresponding second body diode. For example, the first body diode is an inherent body diode associated with the first transistor and the second body diode is an inherent body diode associated with the second transistor. The first transistor and its corresponding first body diode is in series with the second transistor and its corresponding second body. The first body diode and the second body diode form the back-back-diodes circuitry. For example, the first transistor and the first body diode include a second terminal coupled to the battery and a first terminal coupled to a first terminal of the second transistor (e.g., a second power field effect transistor) and a first terminal of the second body diode.

The second transistor and the second diode include a second terminal coupled to a switch node (e.g., a voltage switch node) of the power stage of the tri-level converter. A polarity of the second body diode is reversed relative to a polarity of the first body diode. The first body diode and the second body diode are configured to protect against reverse polarity based on whether the switch node is switching from ground signal to the battery power supply signal or from the battery power supply signal to the boosted power supply signal. Thus, the first body diode and the second body diode prevent conduction through the first transistor and the second transistor when the voltage switch node is connected to ground and/or the auxiliary power supply source. For example, when the switching node is at ground level, the first body diode (or upper diode) is reverse biased, thereby preventing power to flow from the battery to the voltage switch node (or switching node). When the voltage switch node is at a boosted level, then the second body diode (or lower diode) is reverse biased, thereby preventing power to flow from the boosted supply to the battery.

In one aspect of the disclosure, the first transistor is an N-type metal oxide semiconductor (NMOS) field effect transistor (NFET) and the second transistor is a P-type metal oxide semiconductor (PMOS) field effect transistor (PFET). Aspects of the present disclosure improve area efficiency by using a smaller NFET for the first transistor.

When the first transistor is an NFET, a first terminal of the first body diode is coupled to a source of the first transistor and a second terminal of the first body diode is coupled to a drain of the first transistor. When the second transistor is a PFET, a first terminal of a second body diode is coupled to a drain of the second transistor and the second terminal of the second body diode is coupled to a source of the second body diode. Accordingly, the drain of the second transistor is coupled to the source of the first transistor. A gate of the first transistor is driven by a first gate driver and a gate of the second transistor is driven by a second gate driver that is separate from the first gate driver.

The power stage of the tri-level converter further includes a high-side switch region in an auxiliary/boosted power supply path and a low-side switch region coupled to ground. The direct path from the auxiliary power supply source (e.g., a boosted power supply path) extends to the high-side switch region. The high-side switch region includes a high-side switch/transistor and a first cascode transistor. The high-side transistor includes a first terminal coupled to an auxiliary power supply and a second terminal coupled to a first terminal of the first cascode transistor. The first cascode transistor includes a second terminal coupled to a switch node. The first cascode transistor provides protection against high voltage (e.g., up to eight volts) from the auxiliary power supply source. For example, a voltage swing in the boosted power supply path can be up to eight volts. A gate of the high-side transistor is driven by a third gate driver.

The low-side switch region includes a low-side switch/transistor and a second cascode transistor. The low-side transistor includes a first terminal coupled to ground and a second terminal coupled to a first terminal of the second cascode transistor. The second cascode transistor includes a second terminal coupled to a switch node. The second cascode transistor provides protection against high voltage at the switch node. A gate of the low-side transistor is driven by a fourth gate driver. In one aspect of the disclosure, the high-side transistor and the first cascode transistor are PFETs and the low-side transistor and the second cascode transistor are NFETs. For example, when the PFET transistors are turned on, a high voltage (supply) can be passed with minimal voltage drop. When the NFET transistors are turned on, a low voltage (ground) can be passed with minimal voltage drop.

The power stage of the tri-level converter further includes decoupling capacitors. For example, in a printed circuit board (PCB) placement, a first decoupling capacitor is between an auxiliary voltage supply node and a battery supply node while a second decoupling capacitor is between the battery supply node and ground. In some implementations, however, a single or multiple decoupling capacitors (e.g., the first decoupling capacitor and/or the second decoupling capacitor) and the single or multiple decoupling capacitors are connected directly to ground instead of the previous configuration. The actual capacitance value of a capacitor gets de-rated with voltage. For example, as voltage across the capacitor increases, the actual capacitance value decreases. When an actual capacitance value of one microfarad (1 µf) is desirable, a 5 µf capacitor is specified, and this trend worsens as the voltage increase. Therefore, in the configuration where the decoupling capacitors are directly connected to ground, a much bigger capacitor is specified to deliver the same amount of capacitance. But in the configuration where the first decoupling capacitor is between an auxiliary voltage supply node and a battery supply node, the voltage across the first decoupling capacitor (Vaux−Vbatt) is a much smaller voltage thereby improving the capacitor de-rating effect. Moreover, in the configuration where the first decoupling capacitor is between an auxiliary voltage supply node and a battery supply node, during high side switching, a transient current (e.g., high frequency part of the current) is supplied by a decoupling capacitor (e.g., the first decoupling capacitor). This transient current supply from the first decoupling capacitor is efficient and reduces di/dt voltage spikes (which is undesirable for noise performance and for reliability).

Activating the switches or transistors of the power stage of the tri-level converter controls a switching power supply (e.g., voltage) at an output of the tri-level converter, and thus current to flow from the battery voltage source, the auxiliary voltage source or ground into an inductor. This current is then provided to the power amplifier.

Aspects of the present disclosure are also directed to a method of controlling the transistors (e.g., the first transistor and the second transistor) in the battery power supply path during switching of a voltage at the voltage switch node. The first transistor and the second transistor may be controlled through the first gate driver and the second gate driver. For example, the first transistor (e.g., NFET transistor) is switching and the second transistor (e.g., PFET transistor) is configured as a cascode transistor when the voltage switch node switches between an auxiliary voltage and a battery voltage. In this configuration, the second transistor (e.g., PFET transistor) is always on to allow the switching between the auxiliary voltage and the battery voltage.

However, the second transistor (e.g., PFET transistor) is switching and the first transistor (e.g., NFET transistor) is configured as a cascode transistor when the voltage switch node switches from the battery voltage to ground. In this configuration, the first transistor is always on to allow the switching between the battery voltage and ground.

Some aspects of the present disclosure are directed to reliably driving the first transistor and/or the second transistor. For example, the first gate driver or the second gate driver is configured to reliably drive the first transistor or the second transistor when the voltage switch node transitions from ground (e.g., zero volts) to a high voltage (e.g., 7.7-8 volts). The first gate driver or the second gate driver is configured to ensure full rated gate-to-source voltage across the corresponding power FET (e.g., the first transistor or the second transistor) and a corresponding minimum on resistance.

A gate driver (e.g., the first gate driver) of the power stage of the tri-level converter includes a bottom rail connection and a reconfigurable top rail connection. The top rail connection is reconfigured using regulators (e.g., two class AB regulators) and a flying level shifter. The bottom rail connection of the first gate driver is coupled or connected to a node between the first transistor and the second transistor. The node between the first and second transistors switches between ground and the battery voltage regardless of a state of the tri-level converter.

The top rail connection switches between a sum of a ground signal and an internal signal (e.g., a predefined voltage) or a sum of the battery voltage and the predefined voltage. The predefined voltage is a design parameter (e.g., a constant 2.5 volts) to ensure that a power transistor (e.g., the first transistor and/or the second transistor) of the power stage of the tri-level converter has a full gate-to-source rating to achieve improved efficiency. For example, the predefined voltage is designed to achieve an on resistance of the power transistor that is low enough while avoiding a high voltage at the power transistor that causes the transistor to burn out or become unreliable.

The sum of the ground voltage and the predefined voltage, and the sum of the battery voltage and the predefined voltage, are selectively provided to the top rail connection from a first internal regulator and a second internal regulator. For example, the selection of the first internal regulator to provide the sum of the ground voltage and the predefined voltage may be performed using a control device and a switch. Similarly, the selection of the second internal regulator to provide the sum of the battery voltage and the predefined voltage may be performed with the control device and another switch.

When the voltage switch node switches between the auxiliary voltage Vaux and the battery voltage Vbat, the sum of the battery voltage and the predefined voltage (Vbat+Vint) is provided to the top rail connection from a first internal regulator. This way, the first transistor (e.g., NFET transistor) can be turned on. For example, to turn on the NFET transistor, the drive signal is set to "logic high" to pass the sum of the battery voltage and the predefined voltage (Vbat+Vint) provided to the top rail to the gate of the NFET transistor. For example, the gate of the NFET transistor has the voltage Vbat+Vint, and its source has the voltage (Vbat) and the gate to source voltage Vgs of the NFET transistor is Vint. This configuration causes the NFET transistor with small on resistance (Ron) to be turned on.

However, when the voltage switch node switches between the battery voltage Vbat and ground, the top rail connection is switching between two voltages. For example, the sum of the predefined voltage and ground (0+Vint) is selected when the voltage switch node is at ground, and the sum of the battery voltage and the predefined voltage (Vbat+Vint) is selected when voltage switch node is at the battery voltage Vbat. Thus, the gate to source voltage Vgs of the NFET transistor is always equal to Vint, which causes the NFET transistor to stay ON all the time (which is desirable in this switching phase where the NFET transistor operates as cascode transistor).

In one aspect of the disclosure, the first internal regulator and the second internal regulator are internal to an envelope tracking chip. The flying level shifter causes a driving signal to the first transistor to be level shifted to a same level as a supply input (e.g., rail-to-rail voltage) to an internal driver coupled to a gate of the first transistor.

For example, when a bottom rail voltage, which is a supply input to a first terminal of the internal driver, is zero volts or ground, the top rail voltage, which is another supply input to a second terminal of the internal driver, is equal to the predefined voltage (e.g., 2.5 volts). Accordingly, the level shifter shifts the driving signal to the rail-to-rail voltage (e.g., 2.5-0 volts) to the internal driver. However, when the bottom rail voltage is equal to the battery voltage (e.g., 4 volts), the top rail voltage is equal to a sum of the battery voltage and the predefined voltage. Thus, the level shifter shifts the driving signal to the rail-to-rail voltage (e.g., 4+2.5-4 volts). Thus, the predefined voltage is always across the internal driver, which is the specified voltage to cause the second transistor to be fully on so that it exhibits a small on resistance when the second transistor is turned on, which improves efficiency of the second transistor.

FIG. 1 shows a wireless device 110 communicating with a wireless communications system 120. The wireless device 110 includes the multi-level (e.g., tri-level) power supply architecture for radio frequency power amplifiers and avails itself of the advantages of the multi-level power supply architecture. The wireless communications system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
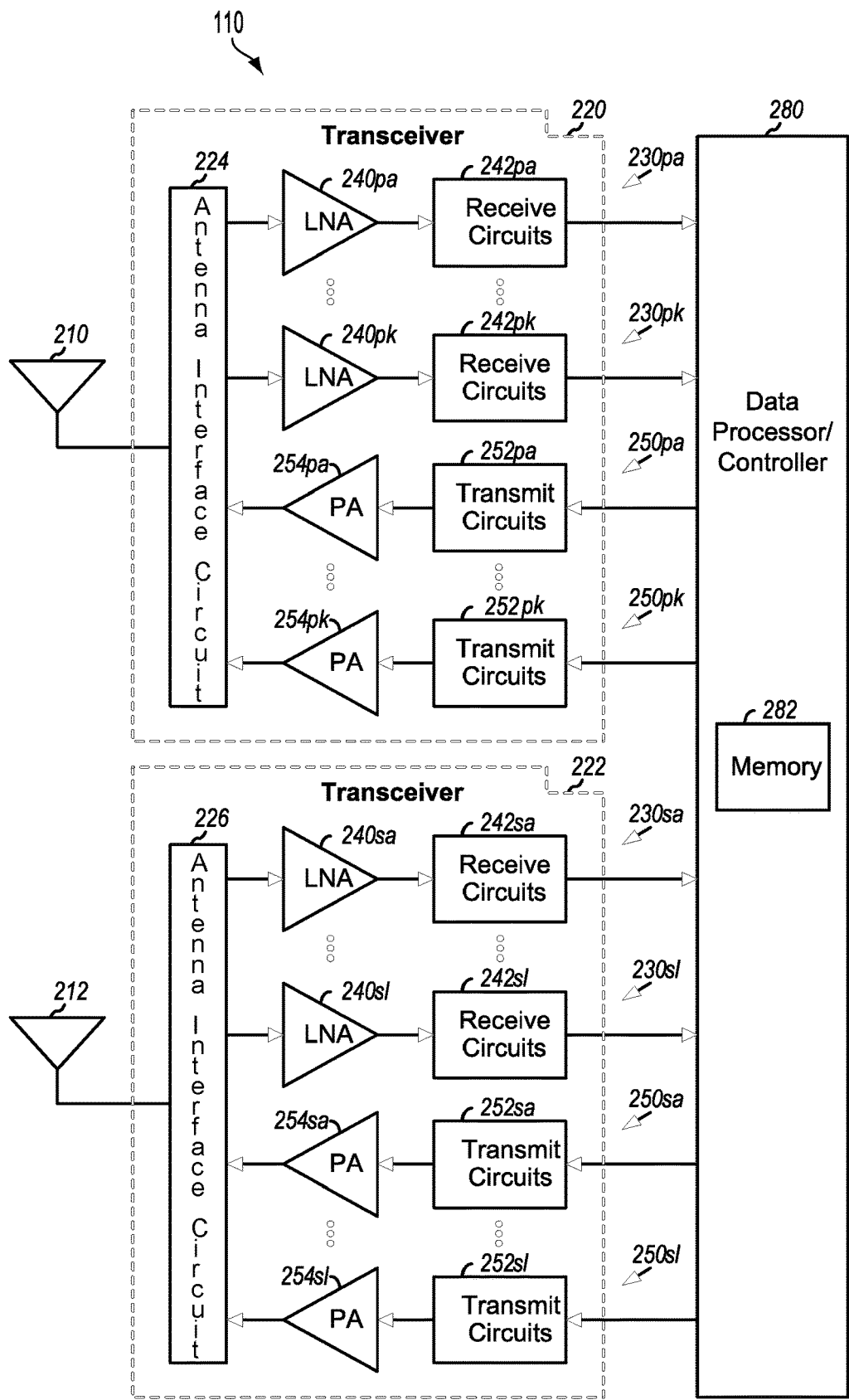
FIG. 2 shows a block diagram of the wireless device in FIG. 1, according to an aspect of the present disclosure.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes L receivers 230sa to 230s1 and L transmitters 250sa to 250s1 to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230pa is the selected receiver. Within the receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230pa.

In the exemplary design shown in FIG. 2, each transmitter 250 includes transmit circuits 252 and a power amplifier (PA) 254. For example, the tri-level power supply architecture modulates the power supply to the power amplifier 254. For data transmission, a data processor 280 processes (e.g., encodes and modulates) data to be transmitted and provides an analog output signal to a selected transmitter. The description below assumes that the transmitter 250pa is the selected transmitter. Within the transmitter 250pa, transmit circuits 252pa amplify, filter, and upconvert the analog output signal from baseband to RF and provide a modulated RF signal. The transmit circuits 252pa may include amplifiers, filters, mixers, matching circuits, an oscillator, an LO generator, a PLL, etc. A power amplifier (PA) 254pa receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
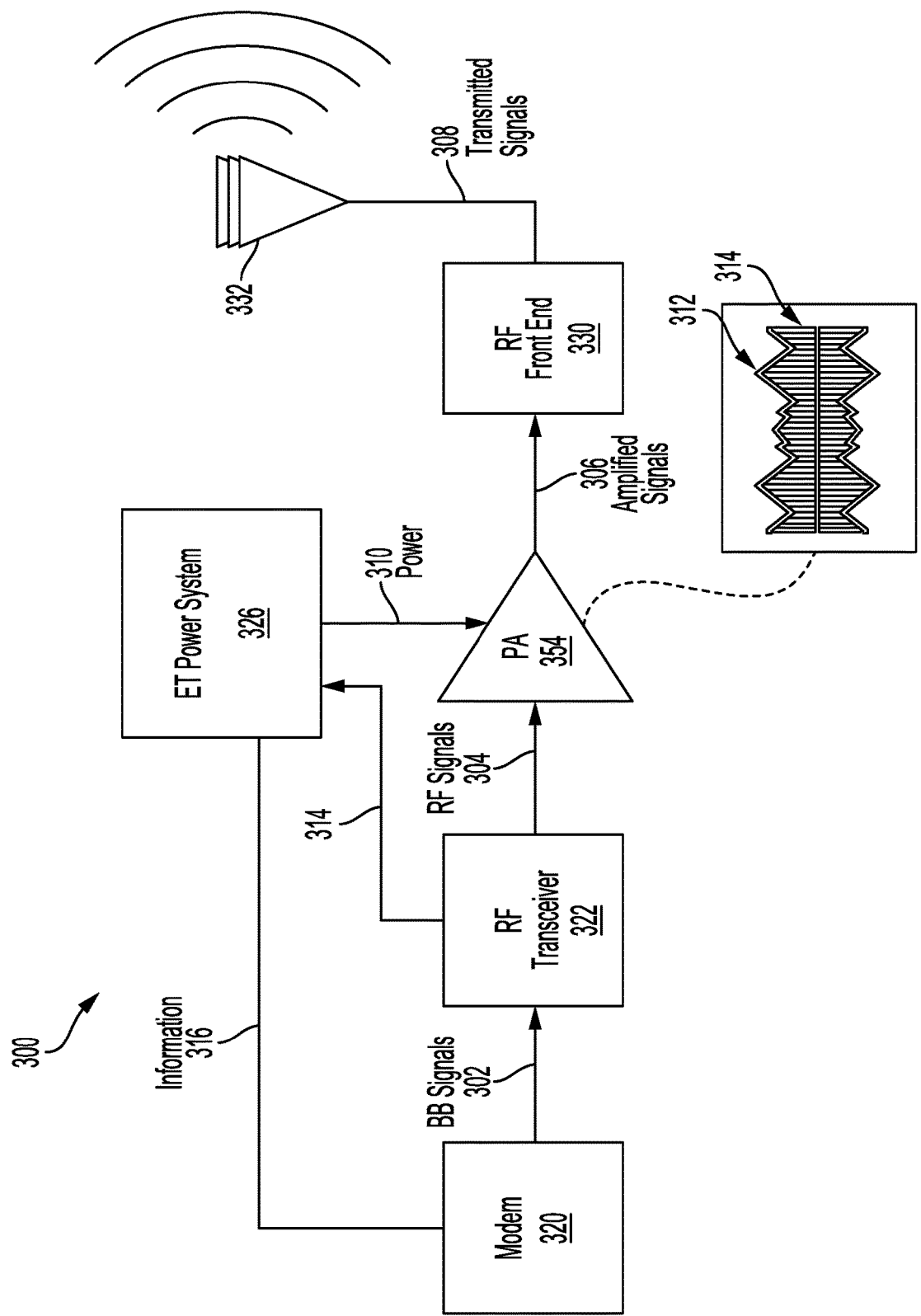
FIG. 3 illustrates a power tracking mechanism for a radio frequency power amplifier.

FIG. 3 illustrates a configuration of a wireless interface 300 including an envelope tracking (ET) power system 326 for a radio frequency power amplifier 354. A transmit path through components of the wireless interface 300 are shown. Although not shown, a receive path may be implemented in similar fashion with received signals bypassing the power amplifier 354 (e.g., via a low-noise amplifier (LNA)) from a radio frequency (RF) front end 330 to an RF transceiver 322.

A modem 320 coordinates with one of the base stations 130 and 132 (of FIG. 1) to establish and define parameters of a communications link. For example, the modem 320 can receive information 316 describing a communications mode, physical broadcast channels, transmit bands, receive bands, antenna configuration, link bandwidth, resource mapping, and the like. Based on this information 316, the modem 320 configures other components of the wireless interface 300 for signal transmission and/or reception, such as the RF transceiver 322, the power amplifier 354, and the RF front end 330.

Generally, to transmit data, the modem 320 encodes the data into baseband signals 302 (BB signals 302). These BB signals 302 are then modulated by the RF transceiver 322 with a carrier frequency to provide RF signals 304. Prior to transmission, the power amplifier 354 amplifies the RF signals 304, and the amplified signals 306 enter the RF front end 330 for routing or band-specific filtering. An antenna 332 then radiates the amplified signals 306 as transmitted signals 308, which are received by the base station 130 or 132 with which the communications link is established.

During amplification, the power amplifier 354 receives power 310 from the ET power system 326, which is described in more detail below. The ET power system 326 adjusts a voltage 312 at which the power 310 is provided to the power amplifier 354 such that the voltage 312 follows an envelope 314 of the RF signals 304 being amplified.

Figure 4:
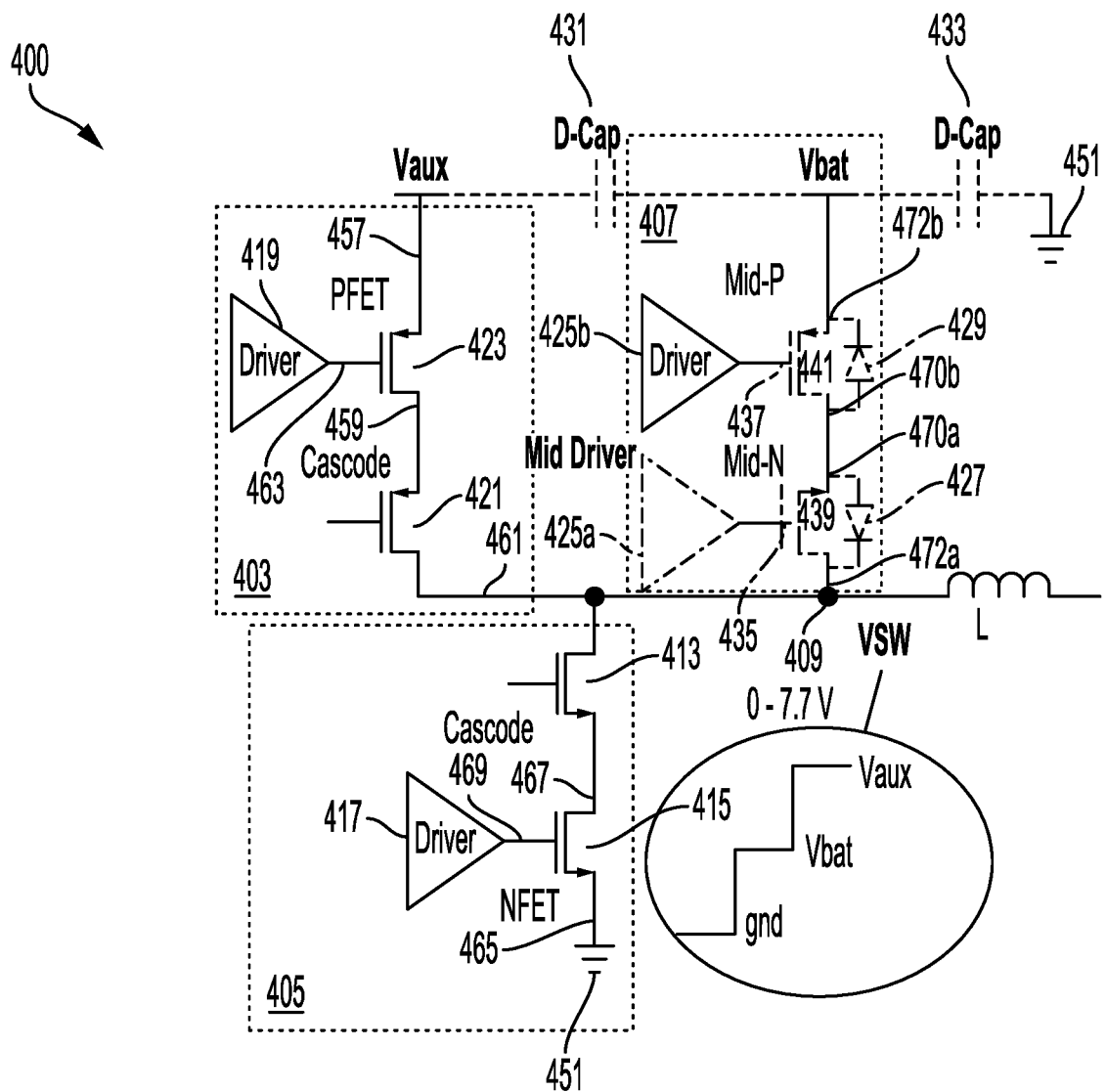
FIG. 4 illustrates a power stage of a tri-level converter for a power amplifier, according to aspects of the present disclosure.

FIG. 4 illustrates a power stage of a tri-level converter 400 of a power amplifier (e.g., the power amplifier 354 of FIG. 3), according to aspects of the present disclosure. In some implementations, the tri-level converter may be of an envelope tracking system or other systems. The tri-level converter 400 includes a high-side switch region 403 in a boosted power supply path and a low-side switch region 405 in a ground path. The tri-level converter 400 also includes a battery power supply region 407 in a battery power supply path. Each of the high-side switch region 403, the low-side switch region 405, and the battery power supply region 407 are coupled to a voltage switch VSW node 409. The power amplifier (not shown) receives a tri-level power supply (e.g., switching states) of the tri-level converter 400 via an inductor L.

The supply to the power amplifier is the voltage after the inductor L. The voltage after the inductor is a filtered version of the voltage at the voltage switch VSW node 409 and may range from 0 to Vaux. The voltage (e.g., switch voltage VSW) at the voltage switch VSW node 409 may include one of three values. For example, the voltage at voltage switch VSW node 409 may be 0 volts, Vbat, or Vaux (which is usually 0, 4, 7).

The high-side switch region 403 includes a high-side switch/transistor 423 and a first cascode transistor 421. In one aspect of the disclosure, both the high-side transistor 423 and the first cascode transistor 421 are P-type metal oxide semiconductor (PMOS) transistors. The high-side transistor 423 includes a first terminal 457 coupled to an auxiliary power supply source (e.g., that provides an auxiliary voltage Vaux) and a second terminal 459 shared with and coupling the high-side transistor 423 to the first cascode transistor 421. The first cascode transistor 421 includes a second terminal 461, which is coupled to or is the same as the voltage switch VSW node 409. The first cascode transistor 421 provides protection for the high-side transistor 423 against high voltage drop from the auxiliary power supply source Vaux to the voltage switch VSW node 409. A voltage swing in the boosted power supply path can be up to eight volts. A gate 463 of the high-side transistor 423 is driven by a third gate driver 419.

The low-side switch region 405 includes a low-side switch/transistor 415 and a second cascode transistor 413. In one aspect of the disclosure, both the low-side transistor 415 and the second cascode transistor 413 are N-type metal oxide semiconductor (NMOS) transistors. The low-side transistor 415 includes a first terminal 465 coupled to ground 451 and a second terminal 467 shared with and coupling the low-side transistor 415 to the second cascode transistor 413. The second cascode transistor 413 shares the second terminal 461 (e.g., the voltage switch VSW node 409) with the first cascode transistor 421. The second cascode transistor 413 provides protection for the low-side transistor 415 against a high voltage at the voltage switch VSW node 409. A gate 469 of the low-side transistor 415 is driven by a fourth gate driver 417.

The tri-level converter 400 of the envelope tracking system further includes a first decoupling capacitor 431 and a second decoupling capacitor 433. For example, in a printed circuit board (PCB) placement, the first decoupling capacitor 431 is between the auxiliary voltage supply source/node and a battery power supply source/node (e.g., that generates a battery voltage Vbat) while the second decoupling capacitor 433 is between the battery power supply node and ground 451.

The tri-level converter 400 further includes switches or transistors to control a switching power supply (e.g., voltage) at an output of the power stage of the tri-level converter 400. For example, the transistors include a first power stage transistor 439 (or first transistor) and a second power stage transistor 441 (or second transistor). The first transistor 439 and the second transistor 441 are laid out in a back-to-back configuration and respectively include a first body diode 427 and a second body diode 429 in the back-to-back configuration. In one aspect, the first body diode 427 is coupled between a first terminal 470a (e.g., a source) and a second terminal 472a (e.g., a drain) of the first transistor 439. The second body diode 429 is coupled between a first terminal 470b (e.g., a drain) and a second terminal 472b (e.g., a source) of the second transistor 441. The back-to-back diodes protect against reverse polarity and ensures correct operation of the voltage switch VSW node 409 by preventing wrong connections through forward body diodes.

For example, when only the NMOS or NFET body diode is specified and the voltage switch VSW node 409 is at 0V, then the NMOS body diode is forward biased, which causes power to transfer from Vbat to the voltage switch VSW node 409. This transfer of power pulls the voltage switch VSW node 409 up to Vbat and away from 0V. To mitigate this issue, the second transistor 441 and its corresponding second body diode 429 are included in a reverse bias configuration, to prevent the transfer of power from Vbat to the voltage switch VSW node 409 or to prevent Vbat from being connected to the voltage switch VSW node 409.

For example, when only the PMOS or PFET body diode is specified and the voltage switch VSW node 409 is at Vaux (e.g., 8V), then the PFET diode is forward biased, which causes power to transfer from voltage switch VSW node 409 to Vbat. This transfer of power pulls the voltage switch VSW node 409 down toward Vbat and away from Vaux. To mitigate this issue, the first transistor 439 and its corresponding first body diode 427 are included in a reverse bias configuration, to prevent the transfer of power from the voltage switch VSW node 409 to Vbat or to prevent Vbat from being connected to the voltage switch VSW node 409.

In one aspect, the first transistor 439 includes an N-type metal oxide semiconductor (NMOS) transistor and the second transistor 441 includes a P-type metal oxide semiconductor (PMOS). The inclusion of the NMOS transistor in the back-to-back transistors reduces area of the tri-level converter 400 and improves efficiency of the tri-level converter 400 because the NMOS transistor has a smaller area and better efficiency. For example, the NMOS transistor has a smaller area and a smaller gate capacitance, which translates to smaller switching losses and improved efficiency.

In operation, the transistors (e.g., the first transistor 439 and the second transistor 441) of the tri-level converter 400 control the switching voltage at the output of the power stage (e.g., at the voltage switch VSW node 409) and cause current to flow from the battery power supply source, the auxiliary voltage source or ground 451 into an inductor L. This current is then provided to a power amplifier (e.g., the power amplifier 354 of FIG. 3) via the inductor L.

Aspects of the present disclosure are also directed to a method of controlling the transistors (e.g., the first transistor 439 and the second transistor 441) in the battery power supply path during switching of a voltage at the voltage switch VSW node 409. The first transistor 439 and the second transistor 441 may be controlled or driven by a first gate driver 425a coupled to a first gate 435 of the first transistor 439 and a second gate driver 425b coupled to a second gate 437 of the second transistor 441. For example, the first transistor 439 is switching and the second transistor 441 is configured as a cascode transistor when the voltage switch VSW node 409 switches from the battery voltage Vbat to the auxiliary voltage Vaux. In this configuration, the second transistor 441 is always on to allow the switching between the battery voltage and the auxiliary voltage Vaux.

The second transistor 441 is switching and the first transistor 439 is configured as a cascode transistor when the voltage switch VSW node 409 switches from ground 451 to a battery voltage Vbat. In this configuration, the first transistor 439 is always on to allow the switching between the battery voltage and ground. The gate drivers (e.g., the first gate driver 425a and the second gate driver 425b) are used to reliably drive the first transistor 439 and the second transistor 441. An example of a reliable gate driver for the first transistor 439 and the second transistor 441 is illustrated in FIG. 5.

Figure 5:
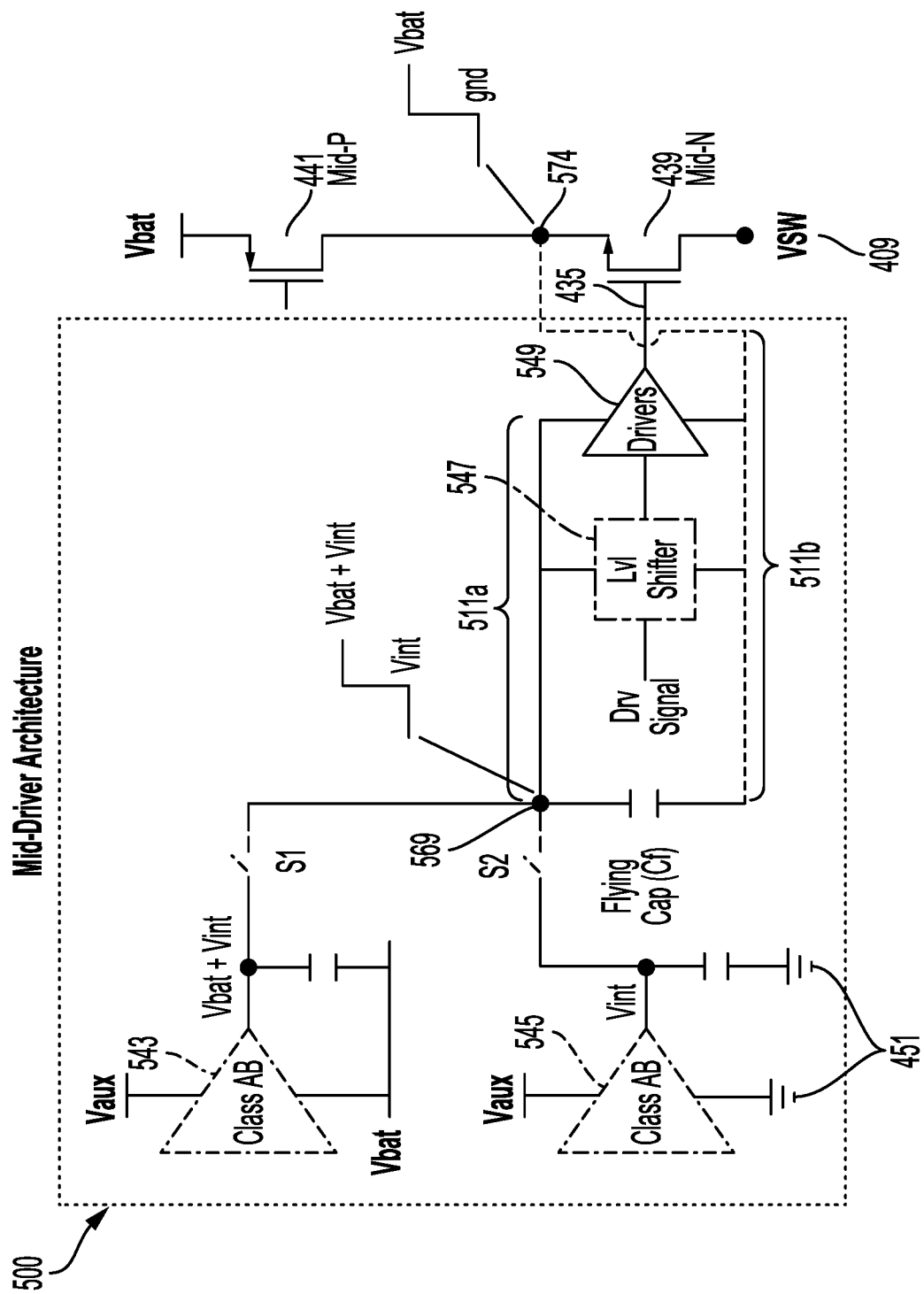
FIG. 5 illustrates a driver architecture for back-to-back transistors in a battery voltage supply path, according to aspects of the present disclosure.

FIG. 5 illustrates a driver architecture 500 of multiple transistors (e.g., the first transistor 439) in a supply path (e.g., a battery voltage supply path), according to aspects of the present disclosure. For illustrative purposes, some of the labelling and numbering of the devices and features of FIG. 5 are similar to those of the FIG. 4.

The driver architecture 500 may include a gate driver 549 configured to reliably drive a first gate 435 of the first transistor 439 when the voltage switch VSW node 409 transitions between ground 451 (e.g., zero volts) and a high voltage (e.g., 7.7-8 volts). The gate driver 549 ensures a full rated gate-to-source voltage across the first transistor 439 as well as a corresponding minimum on resistance. The gate driver 549 may be similar to the first gate driver 425a.

The gate driver 549 includes a bottom rail path 511b and a reconfigurable top rail path 511a. The reconfigurable top rail path 511a is reconfigured using internal regulators (e.g., a first class AB regulator or first internal regulator 543 and a second class AB regulator or second internal regulator 545) and a flying level shifter 547. For example, the reconfigurable top rail path 511a is between the gate driver 549 (e.g., an internal driver) coupled to the first transistor 439 and a reconfigurable node or reconfigurable top rail connection. The bottom rail path 511b of the gate driver 549 is coupled to an internal node 574 (or bottom rail connection) of the power stage of the tri-level converter 400 that is between the first transistor 439 and the second transistor 441. The internal node 574 switches between ground 451 and the battery voltage Vbat regardless of a state of the tri-level converter 400.

The reconfigurable top rail path 511a switches between a sum of a ground voltage and a predefined or internal voltage Vint or a sum of the battery voltage Vbat and the predefined voltage Vint. The predefined voltage Vint is a design parameter (e.g., a constant 2.5 volts) to ensure that the power transistor (e.g., the first transistor 439 and/or the second transistor 441) has a full gate-to-source rating to achieve improved efficiency.

The driver architecture 500 is configured to drive the first transistor 439 to control power supply to the voltage switch VSW node 409 through which an output of the tri-level converter traverses. For example, an output is provided to the power amplifier (not shown) through the voltage switch VSW node 409 and the inductor L (shown in FIG. 4). In one aspect, the auxiliary voltage Vaux, the battery voltage Vbat and the ground voltage are combined to provide a supply to the power amplifier that could take any value from ground to the boosted supply or auxiliary voltage Vaux.

The reconfigurable node 569 is selectively coupled to the first internal regulator 543 and the second internal regulator 545. For example, the first internal regulator 543 is selectively coupled to the reconfigurable node 569 by a first switch S1. The second internal regulator 545 is selectively coupled to the reconfigurable node 569 by a second switch S2. The first internal regulator 543 and the second internal regulator 545 are controlled by an output of the switching states of the tri-level converter. The outputs of the switching states include a battery supply signal, a boosted power supply signal and a ground signal (e.g., a ground voltage). For example, the first internal regulator 543 receives power supply from the battery supply signal (e.g., a battery voltage Vbat) and the boosted power supply signal (e.g., an auxiliary voltage Vaux). The second internal regulator 545 receives power supply from the battery supply signal and the ground signal.

The first switch S1 and second switch S2 are controlled based on switching states. For example, during high-switching (Vbat–Vaux), the first switch S1 is always ON and the second switch S2 is always OFF. During low-switching (gnd–Vbat) the first switch S1 is ON and the second switch S2 is OFF when the voltage switch VSW node 409 is at the battery voltage Vbat. However, when the voltage switch VSW node 409 is at ground (e.g., ground 451), the second switch S2 is ON and the first switch S1 is OFF.

The second internal regulator 545 is configured to generate an internal voltage Vint and the first internal regulator 543 is configured to generate a sum of the internal voltage Vint and the battery voltage Vbat. The internal voltage Vint is a pre-defined voltage. The internal voltage Vint is a design parameter to ensure the power transistors are driven with minimum on resistance (Ron) while being protected from overvoltage across the transistors. The reconfigurable top rail path 511a switches between the sum of the ground voltage and the internal voltage Vint or a sum of the battery voltage Vbat and the internal voltage Vint. The predefined voltage is a design parameter (e.g., a constant 2.5 volts) to ensure that the power transistor (e.g., the first transistor 439 or the second transistor 441) has a full gate-to-source rating to achieve improved efficiency. For example, the predefined voltage is designed to achieve an on resistance that is low enough while avoiding a high voltage at the power transistor that causes the transistor to burn out or become unreliable.

The sum of the ground voltage and the internal voltage Vint and the sum of the battery voltage Vbat and the internal voltage Vint are selectively provided to the reconfigurable top rail path 511a from the first internal regulator 543 and the second internal regulator 545. For example, the selection of the second internal regulator 545 to provide the sum of the ground voltage and the internal voltage Vint may be performed using a control device and a switch S2. Similarly, the selection of the first internal regulator 543 to provide the sum of the battery voltage Vbat and the internal voltage Vint may be performed with the control device and another switch S1. In one aspect of the disclosure, the first internal regulator 543 and the second internal regulator 545 are internal to an envelope tracking chip.

The flying level shifter 547 is coupled to an input of the internal driver 549. The flying level shifter 547 causes a driving signal (Dry Signal) to the first transistor 439 to be level shifted to a same level as a supply input (e.g., rail-to-rail voltage) to the internal driver 549 that is coupled to the first gate 435 of the first transistor 439. The flying level shifter 547 and the internal driver 549 are controlled by the bottom rail path 511b and the reconfigurable top rail path 511a.

Figure 6:
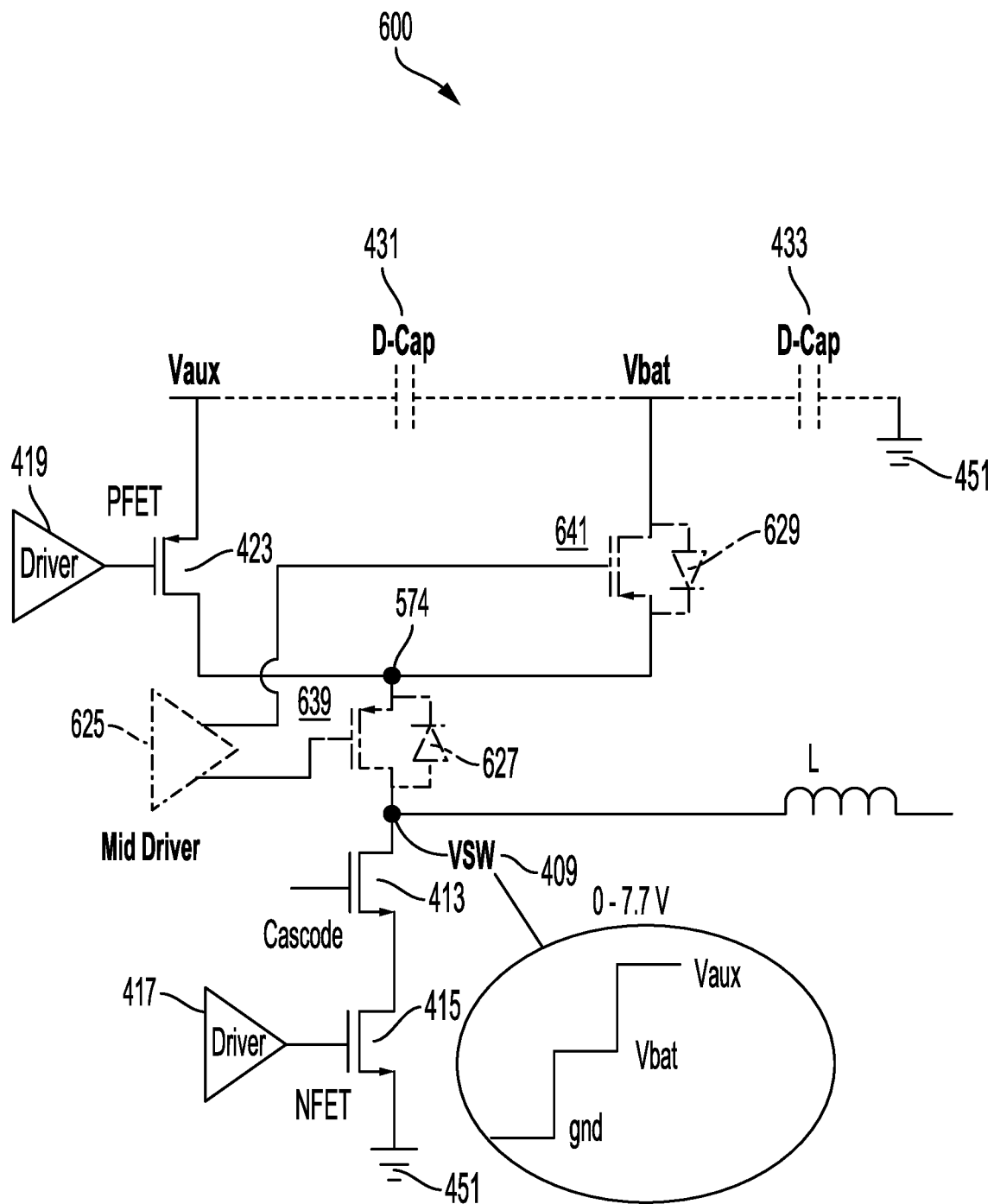
FIG. 6 illustrates another power stage of another tri-level converter for a power amplifier, according to aspects of the present disclosure.

FIG. 6 illustrates another power stage of another tri-level converter 600 of an envelope tracking system for a radio frequency power amplifier, according to aspects of the present disclosure. For illustrative purposes, some of the labelling and numbering of the devices and features of FIG. 6 are similar to those of FIG. 4. In this aspect, the power stage of the tri-level converter 600 includes a first transistor 639 and a second transistor 641 that are P-type metal oxide semiconductor (PMOS) transistors. In this aspect, corresponding back-to-back diodes 627 and 629 of the first and second transistors 639 and 641 have a polarity that is reversed relative to each other to prevent conduction through the first body diode 627 and the second body diode 629 when the voltage switch VSW node 409 is at ground and the auxiliary voltage Vaux, respectively.

In some instances, the body diodes (e.g., back-to-back diodes 627 and 629) may be conducting while the transistors (e.g., the first and second transistors 639 and 641) are not conducting. In these instances, the transistors may be intentionally OFF. However, one of the body diodes may become forward biased to a state that is undesirable for conduction. A back-to-back configuration of the body diodes ensures at least one of the body diodes is reverse biased to prevent unwanted conduction.

The first transistor 639 is shared between the boosted power supply path and the supply path, instead of a separate cascode transistor (e.g., the first cascode transistor 421) allocated to the boosted power supply path (as illustrated in FIG. 4). For example, the first transistor 639, the second transistor 641, and a high-side transistor (e.g., the high-side transistor 423) of the boosted power supply path share a common node (e.g., the internal node 574). Sharing the first transistor 639 in the power stage of the tri-level converter 600 reduces area and increases efficiency, relative to the tri-level converter 400. In this aspect, the first transistor 639 and the second transistor 641 share a same gate driver 625, which is further described with respect to FIG. 7.

The transistors turn ON/OFF in different states including a high-side switching state and a low-side switching state. For example, in the high-side switching state, the common transistor (e.g., the first transistor 639) is always ON while the second transistor 641 and the high-side transistor 423 are switching to create a switching waveform (between the battery voltage Vbat and a swing voltage Vswing) at the internal node 574. The switching is passed on (as is) to the voltage switch VSW node 409 because the first transistor 639) is always ON while the low-side transistor 415 is always OFF. In the low-side switching state, the high-side transistor 423 is always OFF and the second transistor 641 is always ON to pass the battery voltage Vbat (as is) to the internal node 574. The first transistor 639 and the low-side transistor 415 are switching to create a switching waveform (from the battery voltage Vbat to ground) at the voltage switch VSW node 409.

Figure 7:
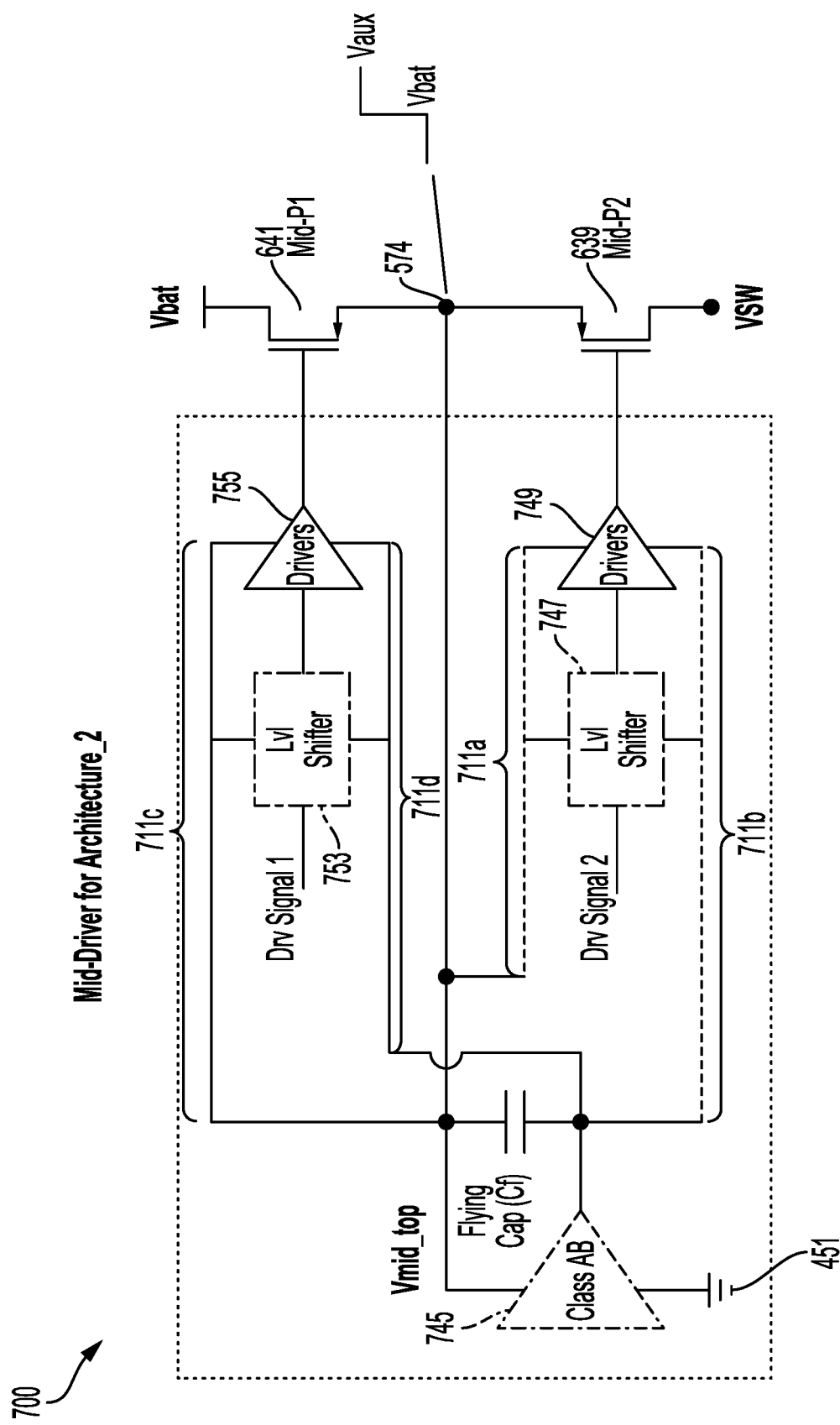
FIG. 7 illustrates another driver architecture for back-to-back transistors and corresponding back-to-back diodes in a battery voltage supply path of the tri-level converter, according to aspects of the present disclosure.

FIG. 7 illustrates another driver architecture 700 (e.g., the gate driver 625) for back-to-back transistors and corresponding back-to-back diodes in a battery voltage supply path of the tri-level converter 600, according to aspects of the present disclosure. For illustrative purposes, some of the labelling and numbering of the devices and features of FIG. 7 are similar to those of FIGS. 4 and 6. The driver architecture 700 includes first and second bottom rail paths 711*b* and 711*d*, respectively coupled between an output of an internal regulator 745 and a first internal driver 749 and a second internal driver 755. Thus, the internal regulator 745 generates the first and second bottom rail paths 711*b* and 711*d* for the first internal driver 749 and the second internal driver 755 of the driver architecture 700. The first internal driver 749 of the driver architecture 700 is coupled to a gate of the first transistor 639 and drives the first transistor 639. The second internal driver 755 of the driver architecture 700 is coupled to a gate of the second transistor 641 and drives the second transistor 641.

The driver architecture 700 includes first and second top rail paths 711*a* and 711*c* coupled to the internal node 574 (which could be a first terminal of the first transistor 639 and/or a first terminal of the second transistor 641). The internal node 574 switches between the battery supply signal and the boosted power supply signal. Power supply to the internal regulator 745 is based on or corresponds to a voltage or power supply at the internal node 574. The voltage at the internal node 574 may be the battery voltage Vbat or the auxiliary voltage Vaux. The internal regulator 745 generates an output that is less than its supply by a predefined voltage. For example, the internal regulator subtracts the internal voltage Vint from its supply to get the output.

The driver architecture 700 further includes first and second flying level shifters 747 and 753, respectively coupled to the first internal driver 749 of the driver architecture 700 and the second internal driver 755 of the driver architecture 700. The first and second flying level shifters 747 and 753 and the first and second internal drivers 749 and 755 are controlled by the first and second top rail paths 711*a* and 711*c* and the first and second bottom rail paths 711*b* and 711*d*.

The flying level shifter 747 is coupled to an input of the first internal driver 749. The flying level shifter 747 causes a driving signal (Dry Signal 2) to the first transistor 639 to be level shifted to a same level as a supply input (e.g., rail-to-rail voltage) to the first internal driver 749. The flying level shifter 753 is coupled to an input of the second internal driver 755. The flying level shifter 753 causes a driving signal (Dry Signal 1) to the second transistor 641 to be level shifted to a same level as a supply input (e.g., rail-to-rail voltage) to the second internal driver 755.

Figure 8:
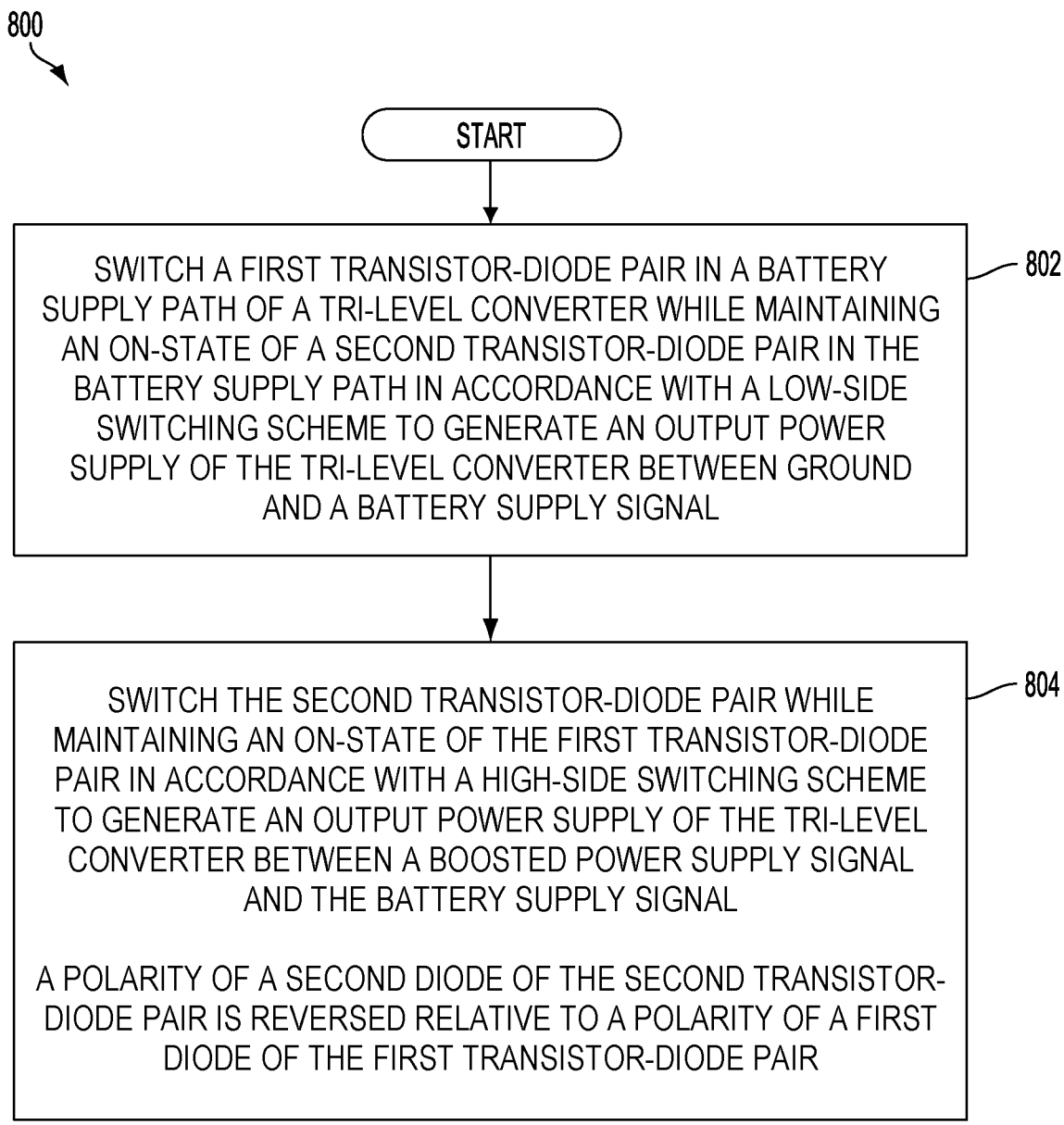
FIG. 8 depicts a simplified flowchart of a method of wireless communications according

FIG. 8 depicts a simplified flowchart of a method 800 of controlling back-to-back transistor-diode pairs in a supply path (e.g., a battery supply path) of a tri-level converter of an envelope tracking system. At block 802, a first transistor-diode pair in the supply path of the tri-level converter switches while an on-state of a second transistor-diode pair in the supply path is maintained in accordance with a low-side switching scheme to generate an output power supply of the tri-level converter between ground and a battery supply signal. At block 804, the second transistor-diode pair switches while an on-state of the first transistor-diode pair is maintained in accordance with a high-side switching scheme to generate an output power supply of the tri-level converter between a boosted power supply signal and the battery supply signal. A polarity of a second body diode of the second transistor-diode pair is reversed relative to a polarity of a first body diode of the first transistor-diode pair.

According to one aspect of the present disclosure, a tri-level converter of an envelope tracking system for a power amplifier is described. The tri-level converter includes means for driving the first transistor and the first body diode. The first transistor and first body diode driving means may, for example, be the first gate driver 425*a*, the internal driver 549, the driver 625, and/or the first internal driver 749. In another aspect, the aforementioned means may be any module or any apparatus or material configured to perform the functions recited by the aforementioned means.

Figure 9:
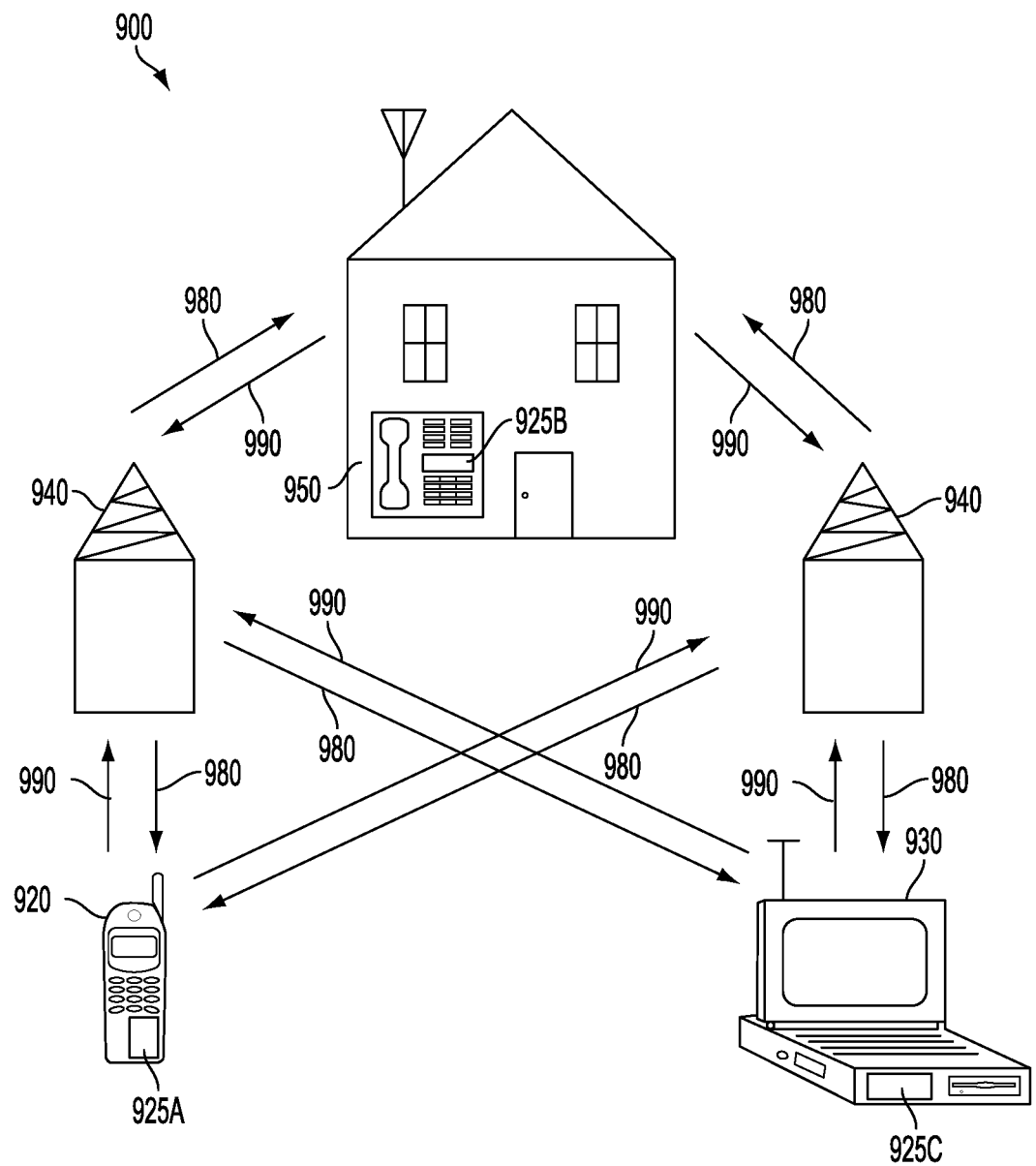
FIG. 9 is a block diagram showing an exemplary wireless communications system in which a configuration of the disclosure may be advantageously employed.

FIG. 9 is a block diagram showing an exemplary wireless communications system in which a configuration of the disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925B, and 925C that include the disclosed tri-level converter. It will be recognized that other devices may also include the disclosed tri-level converter, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the tri-level converter.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A tri-level converter comprising:
    a first supply path coupled to a first supply, the first supply path configured to receive a first supply signal, the first supply path comprising:
    a first transistor having a first terminal coupled to a switching node of the tri-level converter and a first body diode polarity with respect to a second terminal of the first transistor;
    a second transistor comprising a first terminal coupled to the second terminal of the first transistor and a second terminal coupled to the first supply of the tri-level converter, the second transistor having a second body diode polarity with respect to the second terminal of the second transistor, the second body diode polarity being reversed relative to the first body diode polarity; and
    a first driver configured to drive the first transistor to control an output voltage at an output of the tri-level converter, which is coupled to the switching node,
    in which the first transistor is an N-type metal oxide semiconductor (NMOS) transistor and the second transistor is a P-type metal oxide semiconductor (PMOS) transistor.

2. The tri-level converter of claim 1, further comprising:
    a second power supply path coupled to a second power supply, the second power supply path configured to receive a second power supply signal; and
    a ground path coupled to the switching node.

3. The tri-level converter of claim 2, in which the second power supply path comprises:
    a high-side transistor, a first terminal of the high-side transistor coupled to the second power supply; and
    a first cascode transistor having a first terminal coupled to a second terminal of the high-side transistor and a second terminal coupled to the switching node.

4. The tri-level converter of claim 3, in which each of the high-side transistor and the first cascode transistor comprise a P-type metal oxide semiconductor transistor.

5. The tri-level converter of claim 2, in which the ground path comprises:
    a low-side transistor, a first terminal of the low-side transistor coupled to a ground; and
    a second cascode transistor having a first terminal coupled to a second terminal of the low-side transistor and a second terminal coupled to the switching node.

6. The tri-level converter of claim 5, in which each of the low-side transistor and the second cascode transistor comprise an N-type metal oxide semiconductor transistor.

7. The tri-level converter of claim 1, further comprising:
    a first decoupling capacitor between an auxiliary power source and the first supply signal; and
    a second decoupling capacitor between the first supply signal and ground.

8. The tri-level converter of claim 1, in which the first driver comprises:
    a bottom rail connection coupled between the second terminal of the first transistor and the first terminal of the second transistor; and a reconfigurable top rail path coupled between a supply node of an internal driver of the first driver and a reconfigurable node, an output of the internal driver coupled to a gate of the first transistor.

9. The tri-level converter of claim 8, in which a first internal regulator is configured to generate a pre-defined voltage and a second internal regulator is configured to generate a sum of the pre-defined voltage and the first supply signal.

10. The tri-level converter of claim 8, further comprising a flying level shifter coupled to an internal driver, the flying level shifter and the internal driver controlled by the bottom rail connection and the reconfigurable top rail path, the flying level shifter configured to level shift a drive signal to the internal driver to a same level as the internal driver.

11. The tri-level converter of claim 1, in which the first transistor and the second transistor are P-type metal oxide semiconductor (PMOS) transistors.

12. The tri-level converter of claim 11, further comprising:
a second power supply path coupled to a second power supply, the second power supply path configured to receive a second power supply signal; and
a ground path coupled to the switching node.

13. The tri-level converter of claim 12, in which the second power supply path comprises a high-side transistor, a first terminal of the high-side transistor coupled to the second power supply, and a second terminal of the high-side transistor coupled to the first terminal of the first transistor and a first terminal of the second transistor.

14. The tri-level converter of claim 12, in which the ground path comprises a low-side transistor, a first terminal of the low-side transistor coupled to a ground and a second terminal of the low-side transistor coupled to a voltage switch node.

15. The tri-level converter of claim 14, further comprising a cascode transistor coupled between the second terminal of the low-side transistor and the voltage switch node.

16. The tri-level converter of claim 11, in which the first driver comprises:
first and second bottom rail paths, respectively coupled between a first supply node of a first internal driver and a first reconfigurable node, and a second supply node of a second internal driver and a second reconfigurable node; and
first and second top rail connections coupled between the second terminal of the first transistor and the first terminal of the second transistor.

17. The tri-level converter of claim 16, further comprising first and second flying level shifters, respectively coupled to the first internal driver and the second internal driver.

18. A method of controlling back-to-back transistor-diode pairs in a supply path of a tri-level converter, comprising:
switching a first transistor-diode pair in the supply path while maintaining an on-state of a second transistor-diode pair in the supply path in accordance with a low-side switching scheme to generate an output power supply of the tri-level converter between ground and a supply signal of a battery; and
switching the second transistor-diode pair while maintaining an on-state of the first transistor-diode pair in accordance with a high-side switching scheme to generate an output power supply of the tri-level converter between a boosted power supply signal and the supply signal of the battery, a polarity of a second body diode of the second transistor-diode pair is reversed relative to a polarity of a first body diode of the first transistor-diode pair,
in which the transistor of the first transistor-diode pair is an N-type metal oxide semiconductor (NMOS) transistor and the transistor of second transistor-diode pair is a P-type metal oxide semiconductor (PMOS) transistor.

19. A tri-level converter comprising:
a first supply path coupled to a first supply, the first supply path configured to receive a first supply signal, the first supply path comprising:
a first transistor having a first terminal coupled to a switching node of the tri-level converter and a first body diode polarity with respect to a second terminal of the first transistor;
a second transistor comprising a first terminal coupled to the second terminal of the first transistor and a second terminal coupled to the first supply of the tri-level converter, the second transistor having a second body diode polarity with respect to the second terminal of the second transistor, the second body diode polarity being reversed relative to the first body diode polarity; and
means for driving the first transistor to control an output voltage at an output of the tri-level converter, which is coupled to the switching node,
in which the first transistor is an N-type metal oxide semiconductor (NMOS) transistor and the second transistor is a P-type metal oxide semiconductor (PMOS) transistor.

* * * * *